United States Patent
Penton et al.

(10) Patent No.: US 8,977,820 B2
(45) Date of Patent: Mar. 10, 2015

(54) HANDLING OF HARD ERRORS IN A CACHE OF A DATA PROCESSING APPARATUS

(75) Inventors: Antony John Penton, Cambridge (GB); Alex James Waugh, Cambridge (GB); Andrew Christopher Rose, Cambridge (GB); Paul Stanley Hughes, Sunnyvale, CA (US)

(73) Assignee: ARM Limited, Cambridge (GB)

( * ) Notice: Subject to any disclaimer, the term of this patent is extended or adjusted under 35 U.S.C. 154(b) by 1912 days.

(21) Appl. No.: 12/004,476

(22) Filed: Dec. 21, 2007

(65) Prior Publication Data

US 2009/0164727 A1 Jun. 25, 2009

(51) Int. Cl.
| | |
|---|---|
| G06F 12/00 | (2006.01) |
| G06F 12/08 | (2006.01) |
| G06F 11/10 | (2006.01) |
| G11C 29/42 | (2006.01) |
| G11C 29/00 | (2006.01) |
| G11C 15/00 | (2006.01) |
| G11C 29/04 | (2006.01) |

(52) U.S. Cl.
CPC ........ *G06F 12/0864* (2013.01); *G06F 11/1064* (2013.01); *G11C 29/42* (2013.01); *G11C 29/76* (2013.01); *G11C 15/00* (2013.01); *G11C 2029/0409* (2013.01); *G11C 2029/0411* (2013.01)
USPC .......................................... 711/141; 711/118

(58) Field of Classification Search
None
See application file for complete search history.

(56) References Cited

U.S. PATENT DOCUMENTS

| | | | | |
|---|---|---|---|---|
| 3,781,796 | A | * | 12/1973 | Smith ........................... 714/820 |
| 4,506,362 | A | | 3/1985 | Morley |
| 5,119,485 | A | * | 6/1992 | Ledbetter et al. ............. 711/146 |
| 5,835,504 | A | * | 11/1998 | Balkin et al. .................. 714/723 |
| 6,014,756 | A | | 1/2000 | Dottling et al. |
| 6,539,503 | B1 | * | 3/2003 | Walker .......................... 714/703 |
| 6,832,329 | B2 | | 12/2004 | Ahrens et al. |
| 6,892,159 | B2 | | 5/2005 | Weiss et al. |
| 6,948,094 | B2 | | 9/2005 | Schultz et al. |
| 7,328,391 | B2 | * | 2/2008 | Hart et al. ..................... 714/753 |
| 2007/0094569 | A1 | | 4/2007 | Thayer et al. |
| 2008/0201441 | A1 | | 8/2008 | Bodic et al. |

OTHER PUBLICATIONS

J.W. McPherson, "Reliability Challenges for 45nm and Beyond" *DAC 2006*, Jul. 2006, pp. 176-181.
Bondavalli et al., "Discriminating Fault Rate and Persistency to Improve Fault Treatment", *Proceedings of the 27th International Symposium on Fault-Tolerant Computing*, 1997, 9 pages, Jun. 1997.

(Continued)

*Primary Examiner* — Larry Mackall
(74) *Attorney, Agent, or Firm* — Nixon & Vanderhye P.C.

(57) ABSTRACT

A data processing apparatus and method are provided for handling hard errors occurring in a cache of the data processing apparatus. Cache location avoid storage is provided having at least one record, with each record being used to store a cache line identifier identifying a specific cache line. On detection of an error condition, one of the records in the cache location avoid storage is allocated to store the cache line identifier for the specific cache line associated with the entry for which the error condition was detected. A clean and invalidate operation is performed in respect of the specific cache line, and the access request is then re-performed. Cache access circuitry is arranged to exclude any specific cache line identified in the cache location avoid storage from a lookup procedure.

16 Claims, 9 Drawing Sheets

(56) References Cited

OTHER PUBLICATIONS

Constantinescu, "Impact of Deep Submicron Technology on Dependability of VLSI Circuits", *IEEE*, 2002, 5 pages, Jun. 2002.
Bossen et al., "Power4 System Design for High Reliability," (2002), pp. 16-24, Mar. 2002.
Shirvani et al., "Padded Cache: A New Fault-Tolerance Technique for Cache Memories," 6 pgs, Apr. 1999.
Lee et al., "Performance of Graceful Degradation for Cache Faults," (2007), 7 pgs, Mar. 2007.
Fong et al., "Nonvolatile Repair Caches, Repair Embedded SRAM and New Nonvolatile Memories," (2004), 9 pgs, Oct. 2004.
Office Action mailed Nov. 22, 2010 in co-pending U.S. Appl. No. 12/461,695.

\* cited by examiner

HANDLING OF HARD ERRORS IN A CACHE OF A DATA PROCESSING APPARATUS

BACKGROUND OF THE INVENTION

1. Field of the Invention

The present invention relates to techniques for handling errors in a data processing apparatus, and more particularly relates to a data processing apparatus and method for handling hard errors that occur in a cache of the data processing apparatus.

2. Description of the Prior Art

There are many applications for data processing systems where fault tolerance is an important issue. One such application is in safety critical systems, for example automotive systems that control air bags, braking systems, etc. One particular area of fault tolerance is tolerance to errors that can occur in the data stored within the data processing system. A typical data processing apparatus may include one or more storage devices used to store data values used by the data processing apparatus. As used herein, the term "data value" will be used to refer to both instructions executed by a processing device of the data processing apparatus, and the data created and used during execution of those instructions.

The storage devices within the data processing apparatus are vulnerable to errors. These errors may be soft errors, as for example may be caused by neutron strikes, where the state of data held in the storage device can be changed, but the storage device will still write and read data correctly. Alternatively, the errors may be hard errors, as for example caused by electro-migration, in which the affected memory location(s) within the storage device will always store an incorrect data value, and the error cannot be corrected by re-writing the data value to the storage device location(s). Both soft errors and hard errors can often be corrected using known error correction techniques, so that the correct data value can be provided to the requesting device, for example a processor core. However, for the example of a hard error, if the corrected data value is then written back to the same memory location, it will again be stored incorrectly at that memory location, since the hard error stems from a fault in the storage device itself.

As process geometries shrink, and accordingly the storage devices become smaller and smaller, those storage devices become increasingly vulnerable to errors, and hence it is becoming increasingly important in fault tolerant systems to provide robust techniques for detecting such errors.

Often, hard error faults occur due to manufacturing defects. Accordingly, it is known to perform certain hard error detection techniques at production time in order to seek to identify such hard errors. As an example, the article "Nonvolatile Repair Caches Repair Embedded SRAM and New Nonvolatile Memories" by J Fong et al, Proceedings of the 19th IEEE International Symposium on Defect and Fault Tolerance in VLSI Systems (DFT'04) describes a non-volatile repair cache that can be used to repair random defective memory cells in embedded SRAMs and other memory devices. The repair cache takes the form of a direct mapped cache having multiple entries used to identify predetermined repair addresses. When an access request is issued by a processing unit, the memory address specified by that access request is compared with the predetermined repair addresses identified in the various entries of the repair cache, and in the event of a hit the access proceeds with respect to the data held in a register bank of the repair cache, with the main memory's write or read signal being blocked. In the event of a repair cache miss, then the write or read operations will be executed within the main memory bank. In addition to a direct mapped repair cache, an n way set associative repair cache is also discussed. The repair cache is populated at wafer test stage, i.e. during production. Accordingly, whilst the described technique can be used to redirect accesses to addresses where hard errors are detected at production time, the technique does not assist in handling hard errors that occur after production, for example due to process variation and aging, nor is it of any assistance in handling soft errors.

To assist in the detection and handling of errors occurring post production, it is known to store error correction code (ECC) data or the like (generally referred to as error data herein) which can be stored in association with the data values, for reference when seeking to detect any errors in those stored data values.

One known error correction technique which makes use of such error data applies an error correction operation to data values when they are read out from the storage device, and before the data values are supplied to the requesting device. If an error is detected, the process aims to correct the data value using the associated error data and then supplies the corrected data to the requesting device. However, typically the corrected data is not written back to the storage device itself, nor is any attempt made to determine whether the error was a soft error or a hard error.

Whilst such an "in-line" correction technique can handle both hard and soft errors provided they are correctable (i.e. provided sufficient redundant information is available to be able to calculate what the true data value is), it suffers from a number of disadvantages. Firstly, additional logic is required on the read path, and this can adversely affect the timing of the read operation, and also adversely affects power consumption. Such an approach may also require control logic to stall the device performing the read operation (for example a processor pipeline). Additionally, because the data in the storage device is not corrected, there is a possibility that further errors could occur, and that the accumulating errors may change over time from being correctable to uncorrectable, or even undetectable. To seek to address this issue, some data processing systems provide an error "scrubber" mechanism that is used to periodically test and correct the data stored in the storage device. However, this mechanism requires time, and consumes energy.

As an alternative to such an in-line mechanism as described above, an alternative mechanism that could be attempted would be to detect and correct the data value when it is read, to store the corrected data value back to the memory device, and then to retry the read operation (referred to herein as a correct and retry mechanism). In the case of a soft error, this has the effect of correcting the data in the storage device, and hence when the read operation is retried, the correct data is read. However, if the error is a hard error, then the error will re-occur when the read is retried, and the operation will hence enter a loop where the data value is corrected, but continues to be wrong when re-read from the storage device. In this situation there is the potential for the system to "spin-lock", trapped in a loop of accessing, attempting correction and retrying, unless mechanisms are in place to spot such a behavior and break out of the loop.

Whilst the above issues are generally applicable to any type of storage device provided within the data processing apparatus, further specific issues can arise if the storage device in question is a cache. One or more caches are often provided within a data processing apparatus to temporarily store data values required by a processing unit of the data processing apparatus so as to allow quick access to any such cached data values. As is known in the art, the cache will typically consist of a plurality of cache lines, and for each cache line storing valid data, an address identifier is provided within the cache identifying an address portion which is shared with all of the data values in that cache line. When an access request is issued specifying a memory address associated with a cacheable region of memory, a lookup procedure will be performed in the cache to seek to identify whether a portion of the memory address specified in the access request matches an address identifier in the cache, and if it does the access may proceed directly in the cache without the need to access the memory.

If a write through (WT) mode of operation is used for the cache lines, then any write updates made to the cache line contents will be replicated in memory so as to maintain consistency between the cache contents and the memory contents. However, if a write back (WB) mode of operation is employed, then any updates made to the contents of a cache line are not immediately replicated in the corresponding locations in memory. Instead, only when a cache line is later evicted, is the relevant data in memory brought up to date with the contents in the cache line (the need to do this is typically indicated by a dirty bit value, which is set if the cache line contents are written to whilst stored in the cache).

Considering the issue of hard or soft errors occurring in a cache, then as with other storage devices error correction code data can be stored in association with the cache contents with the aim of enabling errors to be detected.

If the cache can be arranged as a write through cache, then there are two possible approaches that can be taken on detection of an error in a particular cache line. In accordance with a first technique (which will be referred to herein as an "assume miss and invalidate" approach), the access can simply be considered to have missed in the cache. The data will then be retrieved from a lower level in the memory hierarchy. At the same time, in order to prevent errors accumulating in the cache, the cache line is invalidated. The data retrieved may typically be streamed into the device requesting the data, for example the processor core, but often will be reallocated into the cache. If the original error occurred as the result of a hard error, and the refetched data from memory is allocated into the same cache line, then the next time the data is accessed in the cache, the same error is likely to be detected again. This will potentially cause significant performance degradation.

In accordance with a second, alternative, technique for a write through cache (referred to as an "invalidate and retry" mechanism), on detection of an error in a particular cache line, that cache line can merely be invalidated and the access retried without the need to seek to perform any correction on the data held in the cache line. When the access is retried, a miss will occur in the cache, and the data will be retrieved from a lower level in the memory hierarchy. As with the first technique, this retrieved data may typically be streamed into the device requesting the data, for example the processor core, but often will be reallocated into the cache, so that a cache hit will occur on the next access. If the original error occurred as the result of a hard error then, when the access is retried, the same error is likely to be detected again. The processor will get stuck in a spinlock, continually retrying the access and detecting the error.

The problems become even more complex if the cache is at least partially a write back cache, since if an error is detected in a cache line using such a write back mechanism, then it is not merely sufficient to invalidate the cache line, but instead the cache line contents must first be corrected and then evicted to memory. Accordingly the "assume miss and invalidate" approach that can be applied to a write through cache cannot be used for a write back cache, because the cache line with the error in it may be valid and dirty, and hence if the first technique were used the dirty data would be lost. The "invalidate and retry" approach can be used, but as part of the invalidate operation the cache line will need to be corrected (i.e. a correct and retry style operation is needed). This applies not only to the data values in the cache line itself, but also to the associated address identifier, and associated control data such as the valid bit indicating if the cache line is valid and the dirty bit indicating if the cache line is dirty, since all of these contents may potentially be subject to errors. Hence, by way of example, if the valid bit is itself corrupted by an error, the cache line that holds valid data may appear from the associated valid bit to not hold valid data. Accordingly, when adopting a write back mode of operation in a cache, it may be necessary to perform error detection and correction even on cache lines that on face value appear to be invalid.

A number of papers have been published concerning the detection and handling of errors occurring in caches. For example, the article "PADded Cache: A New Fault-Tolerance Technique for Cache Memories", by P Shirvani et al, Center for Reliable Computing, Stanford University, 17$^{th}$ (1999) IEEE VLSI Test Symposium, describes a technique that uses a special programmable address decoder (PAD) to disable faulty blocks in a cache and to re-map their references to healthy blocks. In particular, a decoder used in a cache is modified to make it programmable so that it can implement different mapping functions. A group of flip-flops within the decoder are connected as a shift register and loaded using special instructions. Accordingly, it will be appreciated that the approach described therein is one that would be employed as part of a Built-In Self Test (BIST) procedure, and hence requires the faulty blocks in the cache to be identified, and the programmable address decoder programmed, prior to normal operation of the data processing apparatus. The technique can hence not be used to handle errors that only manifest themselves during normal operation.

The article "Performance of Graceful Degradation for Cache Faults" by H Lee et al, IEEE Computer Society Annual Symposium on VLSI (ISVLSI'07) examines several strategies for masking faults, by disabling faulty resources such as lines, sets, ways, ports or even the whole cache. A cache set remapping scheme is also discussed for recovering lost performance due to failed sets. As explained in Section 5.2, it is assumed that the faults in the cache memory are detected and necessary cache reconfiguration is done before program execution. Hence, as with the earlier-mentioned article, the techniques described therein cannot be used to handle errors that manifest themselves during normal operation, for example soft errors, or hard errors that occur for example through aging.

The article "Power4 System Design for High Reliability" by D Bossen et al, IBM, pages 16 to 24, IEEE Micro, March-April 2002, provides a general discussion of fault tolerance, and describes some specific schemes employed in association with a cache. A level 1 data cache is identified which is arranged as a store-though design (equivalent to the write through design mentioned earlier), so as to allow error recovery by flushing the affected cache line and refetching the data from a level 2 cache. The paper also discusses use of hardware and firmware to track whether the particular ECC mechanism corrects permanent errors beyond a certain threshold, and after exceeding this threshold the system creates a deferred repair error log entry. Using these error log entries, mechanisms such as a cache line delete mechanism can be used to remove a faulty cache line from service. A BIST-based mechanism is also described where programmable steering logic permits access to cache arrays to replace faulty bits. Hence, it can be seen that the techniques described in this paper involve either arranging the cache as a simple write through cache, or alternatively require the need for complex techniques to maintain logs of errors and make decisions based on the log entries, such techniques consuming significant power and taking up significant area within the data processing apparatus. There are many applications where such power and area hungry mechanisms will not be acceptable. Further, there is no discussion of the earlier-mentioned problems that can occur particularly in write back caches, and in particular no discussion as to how hard errors in such write back caches could be handled.

Accordingly, it would be desirable to provide a simple and effective mechanism for handling errors occurring within a cache of a data processing apparatus, which can yield improved performance relative to the earlier-mentioned "in-line" correction mechanisms, and which can be used not only in association with write through caches but also write back caches.

SUMMARY OF THE INVENTION

Viewed from a first aspect, the present invention provides a data processing apparatus comprising: a processing unit for performing data processing operations; cache storage for storing data values for access by the processing unit when performing said data processing operations, the cache storage comprising data storage having a plurality of cache lines for storing data values, and address storage having a plurality of entries, each entry identifying for an associated cache line an address indication value, and each entry having associated error data; cache access circuitry, responsive to an access request issued by the processing unit specifying an access address, to perform a lookup procedure to determine with reference to the address indication value held in at least one entry of the address storage whether a hit condition exists in one of said cache lines; error detection circuitry, responsive to the access request, to determine with reference to the error data associated with said at least one entry of the address storage whether an error condition exists for that entry; cache location avoid storage having at least one record, each record for storing a cache line identifier identifying a specific cache line; on detection of said error condition, one of said at least one records in the cache location avoid storage being allocated to store the cache line identifier for the specific cache line associated with the entry for which the error condition was detected, the error detection circuitry causing a clean and invalidate operation to be performed in respect of the specific cache line, and causing the access request to be re-performed; the cache access circuitry excluding any specific cache line identified in the cache location avoid storage from the lookup procedure.

In accordance with the present invention, a cache location avoid storage having at least one record is provided within the data processing apparatus, with the cache location avoid storage being populated during normal use of the data processing apparatus. In particular, when an access request is issued by a processing unit of the data processing apparatus, a lookup procedure is performed within cache storage of the data processing apparatus to see if a hit condition exists in one of the cache lines. For those entries of the address storage which are referenced during the lookup procedure, the associated error data is referenced by error detection circuitry in order to determine whether an error condition exists in any of those entries. If an error condition is detected, then a record in the cache location avoid storage is allocated to store the cache line identifier for the specific cache line associated with the entry for which the error condition was detected. Further, a clean and invalidate operation is performed in respect of the specific cache line and the access request is then re-performed. When performing each lookup procedure, the cache access circuitry excludes any specific cache line identified in the cache location avoid storage.

The present invention provides a simple and effective mechanism for ensuring that hard errors occurring in the cache storage do not cause incorrect operation, when accesses are performed in respect of the cache storage, whilst allowing the advantages of an invalidate and retry/correct and retry mechanism to be retained, such as the fact that the error detection mechanism can be provided on a separate path to the normal data retrieval path (providing both power and timing benefits).

In one embodiment, the mechanism employed does not seek to distinguish between soft errors and hard errors, but ensures that if an error detected was in fact a hard error it cannot cause operability problems in the operation of the cache storage. Further, the technique of the present invention can be employed not only in association with write through caches but also write back caches, thus providing a very flexible solution.

In accordance with the present invention, a clean and invalidate operation is performed in respect of a specific cache line when an error condition is detected in association with that cache line. For a write through cache line, this may merely involve invalidating the line, whereas for a write back cache line, if the cache line is dirty, then the data must be corrected before it is written out to the memory system. Such correction includes the data stored in the cache line, the address identifier that identifies the cache line, and even the valid and dirty bits that indicate when the cache line is valid and when it contains data that is not coherent with the memory system. Whilst in many implementations each cache line has a single valid bit and a single dirty bit, in some implementations the valid and dirty information may each be represented by multiple bits. However, for simplicity the terms "valid bit" and "dirty bit" will be used herein, and are intended to cover single bit and multi-bit values.

Once the cache line has been cleaned and invalidated, a retry of the access should then miss in the cache, causing the required data to be fetched from the memory system in the normal way (for example as part of a linefill operation).

A hard error occurring in the data stored in the cache, or in the dirty bits, can be dealt with effectively using the above steps, provided that when the data is refetched from the memory system it is streamed into the processing unit. However, after this has happened, and if the present invention is not employed, then following the linefill operation the cache line will be valid and subsequent reads from the some location are likely to detect the error again and require reperformance of the above steps. This will potentially cause significant performance degradation when a hard error of this type occurs. In accordance with the present invention, this problem is removed through population of a record in the cache location avoid storage to identify the specific cache line as a cache line to be avoided. Hence any linefill operation will not cause the data to be re-stored in the same cache line, and hence avoids the above problem that could otherwise occur if the error is a hard error.

Another problem which the present invention addresses is as follows. If the entry in the address storage maintains both the address indication value and a valid field identifying whether the cache line is valid, then an error detected must always be dealt with by attempting to clean and invalidate the corresponding cache line, followed by a retry of the access request, whether or not the line is indicated by the valid field as being valid. This is because the error may have occurred in the valid field itself, and a valid cache line may actually be marked as invalid. However, even if erroneous cache lines are always treated as valid, a hard error in the location storing the valid field or the location storing the address indication value may make it impossible to invalidate the line (and record the correct error data), so an error would be detected every time that cache line is subjected to the lookup procedure, thus requiring a retry operation to be invoked every time. However, the present invention again removes this problematic condition by ensuring that on determination of the error condition, a record in the cache location avoid storage is populated to identify the specific cache line so that that cache line is not involved in the lookup procedure when the access request is re-performed. Instead the specific cache line is now known to be invalid by virtue of it being identified in the cache location avoid storage. Hence, on re-performing the lookup, if no further errors are detected and no hit is detected, a cache miss signal can be issued to cause the data to be retrieved from the next level of the memory system.

Hence, through use of the simple and effective mechanism of the present invention, errors occurring in the cache storage can be handled using a "correct-and-retry" style mechanism, whilst being robust to hard errors that may manifest themselves during normal operation, and in particular allowing correct data to be returned even in the presence of such a hard error.

The technique of the present invention can be applied for any type of access request, and accordingly the mechanism of the present invention may be employed for either or both of write and read access requests. In one embodiment, the technique of the present invention is employed at least for read access requests.

In one embodiment, the cache location avoid storage is provided by a small piece of storage, and will not typically have sufficient records to enable cache line identifiers to be retained for all specific cache lines where errors are detected during use of the data processing apparatus. Accordingly, in one embodiment, the data processing apparatus further comprises allocation circuitry for allocating said one of the records of the cache location avoid storage on detection of said error condition, if every record of the cache location avoid storage has an existing cache line identifier stored therein at the time said error condition is detected, the allocation circuitry invalidating one of said existing cache line identifiers to free said one of the records to be allocated for storing the cache line identifier for the specific cache line associated with the entry for which the error condition was detected. In such embodiments, it will be appreciated that the cache location avoid storage is not seeking to establish over time a complete record of all specific lines where errors have been detected, nor is it seeking to be used to distinguish between soft errors and hard errors. Instead, the purpose of the cache location avoid storage is to ensure that at any point in time, correct operation can be ensured even in the presence of a hard error, and hence using automotive terminology may be said to facilitate a "limp home" mode of operation.

In one particular embodiment, the cache location avoid storage comprises a single record, and hence at any point in time only identifies a single specific cache location to be avoided. It has been found that in many implementations this still provides an effective mechanism for enabling correct operation of the cache storage at any point in time, even in the presence of a hard error. Each time a new error condition is detected, the content of the cache location avoid storage is overwritten with the cache line identifier for the newly identified specific cache line, hence ensuring that when the access request is re-performed, the access request will be processed correctly. Whilst the use of the cache location avoid storage will have been unnecessary if the error was in fact a soft error, by not seeking to distinguish between soft and hard errors, and merely the using the cache location avoid storage on detection of every error condition, a small, low power and low cost mechanism can be provided which can effectively handle hard errors manifesting themselves during use, so as to allow correct operation of the cache storage in the presence of those hard errors.

In one embodiment, at least part of the cache storage operates as a write back cache, and the error detection circuitry includes error correction circuitry, responsive to the error condition, to apply an error correction operation to correct content of the entry for which that error condition was detected, prior to the clean and invalidate operation being performed. By performing such error correction, it can be ensured that the correct address indication value is used when evicting the relevant cache line from the cache storage in the event that that cache line is determined to be dirty.

In one particular embodiment, the content of each entry includes, in addition to the address indication value, a valid identifier identifying if the associated cache line is valid, and the error detection circuitry determines whether the error condition exists even if the valid indication as stored in the entry being reviewed by the error detection circuitry indicates that the associated cache line is invalid. Such an approach ensures that even if the valid identifier becomes corrupted due to an error, correct operation can still be ensured when using the techniques of embodiments of the present invention in association with a write back portion of the cache.

In addition to using the contents of the cache location avoid storage to identify cache lines which should be excluded from the lookup procedure, in one embodiment when a cache line in the cache storage needs to be selected as an allocated cache line for the storage of data values, any specific cache line identified in the cache location avoid storage is excluded from selection as the allocated cache line. Hence, each specific cache line identified in the cache location avoid storage is excluded from both lookup procedures and linefill operations.

The cache storage can take a variety of forms. In one embodiment, the cache storage is an n way set associative cache, and the access address of the access request identifies a particular set in the cache having a cache line in each way of the cache. Each cache line identifier stored in the cache location avoid storage identifies the specific cache line by identifying a cache set and at least one cache way, and the error detection circuitry performs error detection for each cache line in the particular set other than any specific cache line of that particular set identified in the cache location avoid storage. Hence, in such an embodiment, the set and way identifiers are used to identify each specific cache line in the cache location avoid storage, and the error detection circuitry excludes any such identified cache line from the error detection procedures. Hence, it will be appreciated that in such embodiments any specific cache line identified in the cache location avoid storage is excluded from both the lookup procedure employed by the cache access circuitry and the error detection procedure performed by the error detection circuitry.

In one embodiment, each record is arranged to only identify a single specific cache line. Hence, if multiple errors occurred in multiple ways of a particular set, multiple records would be needed to identify the multiple ways, or some form of arbitration would be needed to determine which ways to be identified in the cache location avoid storage. However, in an alternative embodiment, each record is able to identify more than one cache way of a particular cache set (for example by providing within the record a bit for each way, each bit being settable to identify that an error has been detected in that associated way), hence allowing such multiple errors to be identified by a single record.

The cache location avoid storage can be arranged in a variety of ways. In one embodiment, the cache location avoid storage is formed as a cache. In one particular embodiment, the cache location avoid storage is formed as a fully associative cache where any specific cache line in the cache storage that is to be avoided can be identified in any record of the cache location avoid storage. In an alternative embodiment, the cache location avoid storage may be a direct mapped cache, such that any particular specific cache line to be avoided can only be identified in one particular record. Using a fully associative cache structure provides more flexibility than a direct mapped structure, but also is typically larger than a direct mapped cache structure assuming the same number of records, due to the additional comparators required in a fully associative cache structure. In another embodiment, the cache location avoid storage may be formed as a set associative cache.

In one embodiment, mechanisms may be put in place to seek to detect the presence of errors in the information stored in the cache location avoid storage. In one particular embodiment, the processing unit, cache access circuitry, error detection circuitry and cache location avoid storage are provided within processing circuitry, the processing circuitry being duplicated in the data processing apparatus by duplicate processing circuitry, and the data processing apparatus further comprises: comparison circuitry for detecting errors occurring in operations of said processing circuitry by comparison with operations of said duplicate processing circuitry. Whilst this is a relatively expensive solution due to the requirement to provide the duplicate processing circuitry, it will provide significant improved robustness to errors in safety critical applications. In particular, any errors occurring in operations of the processing circuitry can be detected by comparison with the operations of the duplicate processing circuitry. Typically, such detection occurs by comparing the outputs from both the processing circuitry and the duplicate processing circuitry. Hence, as an example, if an error did occur in the cache location avoid storage of the processing circuitry, then by comparing the outputs from the processing circuitry and the duplicate processing circuitry, the presence of that error would be detected. This can be used to initiate any one of a number of known recovery mechanisms.

In one embodiment, in addition to providing the error data in association with each entry of the address storage, each cache line also has associated cache line error data, and the error detection circuitry further determines the presence of the error condition if the cache line error data for any cache line whose associated address storage entry is referenced during the lookup procedure indicates an error. Hence, any errors occurring in either the address storage entry or the associated cache line will trigger the error condition, and cause the allocation of one of the records within the cache location avoid storage to store the relevant cache line identifier, and the initiation of the retry operation.

There are a number of ways in which the error detection circuitry can cause the access request to be re-performed following the detection of the error condition. In one embodiment, the error detection circuitry causes the access request to be re-performed by issuing a branch to self control signal to the processing unit to cause the processing unit to re-execute an instruction that caused the access request to be issued. The use of a branch to self mechanism provides a particularly simple and effective mechanism for causing re-execution of the instruction that issued the access request.

Whilst in embodiments of the present invention, the mechanism employed does not seek to distinguish between soft errors and hard errors at the time a record is allocated in the cache location avoid storage, in one embodiment the presence of a hard error can be determined at a later point. In particular in one embodiment, whilst the cache access circuitry excludes any specific cache line identified in the cache location avoid storage from the lookup procedure, the error detection circuitry is arranged to detect whether an error condition exists for the entry associated with that specific cache line, and on such detection to produce a hard error detect signal indicating that a hard error has been detected. Hence, in this embodiment, the error information produced by the error detection circuitry in this particular situation is not used to cause another allocation to the cache location avoid storage, but instead is used to identify that an error has re-occurred in a cache line despite efforts taken to fix it via the clean and invalidate operation performed at the time the record in the cache location avoid storage was allocated for that cache line. Hence this implies the presence of a hard error in that cache line, and may provide useful additional information. For example, in embodiments where the cache location avoid storage has multiple records, the allocation circuitry may use such information so as to preferentially replace records not identified as relating to cache lines with hard errors. As another example, a record of the number of times the hard error detect signal is issued could be kept, and this statistical information could be used to indicate to the user that the data processing apparatus is degrading, for example by triggering an alarm indication when a certain threshold is reached.

Viewed from a second aspect, the present invention provides processing circuitry for coupling with cache storage to access data values stored in the cache storage, the cache storage comprising data storage having a plurality of cache lines for storing data values, and address storage having a plurality of entries, each entry identifying for an associated cache line an address indication value, and each entry having associated error data, the processing circuitry comprising: a processing unit for performing data processing operations; cache access circuitry, responsive to an access request issued by the processing unit specifying an access address, to perform a lookup procedure to determine with reference to the address indication value held in at least one entry of the address storage whether a hit condition exists in one of said cache lines; error detection circuitry, responsive to the access request, to determine with reference to the error data associated with said at least one entry of the address storage whether an error condition exists for that entry; cache location avoid storage having at least one record, each record for storing a cache line identifier identifying a specific cache line; on detection of said error condition, one of said at least one records in the cache location avoid storage being allocated to store the cache line identifier for the specific cache line associated with the entry for which the error condition was detected, the error detection circuitry causing a clean and invalidate operation to be performed in respect of the specific cache line, and causing the access request to be re-performed; the cache access circuitry excluding any specific cache line identified in the cache location avoid storage from the lookup procedure.

Viewed from a third aspect, the present invention provides a method of handling errors in a data processing apparatus having a processing unit for performing data processing operations, and cache storage for storing data values for access by the processing unit when performing said data processing operations, the cache storage comprising data storage having a plurality of cache lines for storing data values, and address storage having a plurality of entries, each entry identifying for an associated cache line an address indication value, the method comprising the steps of: storing error data in association with each entry in the address storage; responsive to an access request issued by the processing unit specifying an access address, performing a lookup procedure to determine with reference to the address indication value held in at least one entry of the address storage whether a hit condition exists in one of said cache lines; responsive to the access request, determining with reference to the error data associated with said at least one entry of the address storage whether an error condition exists for that entry; providing a cache location avoid storage having at least one record, each record for storing a cache line identifier identifying a specific cache line; on detection of said error condition, allocating one of said at least one records in the cache location avoid storage to store the cache line identifier for the specific cache line associated with the entry for which the error condition was detected; performing a clean and invalidate operation in respect of the specific cache line, and causing the access request to be re-performed; when performing the lookup procedure for the access request, excluding any specific cache line identified in the cache location avoid storage from the lookup procedure.

Viewed from a fourth aspect, the present invention provides a data processing apparatus comprising: processing means for performing data processing operations; cache storage means for storing data values for access by the processing means when performing said data processing operations, the cache storage means comprising data storage means having a plurality of cache lines for storing data values, and address storage means having a plurality of entries, each entry identifying for an associated cache line an address indication value, and each entry having associated error data; cache access means, responsive to an access request issued by the processing means specifying an access address, for performing a lookup procedure to determine with reference to the address indication value held in at least one entry of the address storage means whether a hit condition exists in one of said cache lines; error detection means, responsive to the access request, for determining with reference to the error data associated with said at least one entry of the address storage means whether an error condition exists for that entry; cache location avoid storage means having at least one record, each record for storing a cache line identifier identifying a specific cache line; on detection of said error condition, one of said at least one records in the cache location avoid storage means being allocated to store the cache line identifier for the specific cache line associated with the entry for which the error condition was detected, the error detection means causing a clean and invalidate operation to be performed in respect of the specific cache line, and causing the access request to be re-performed; the cache access means excluding any specific cache line identified in the cache location avoid storage means from the lookup procedure.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
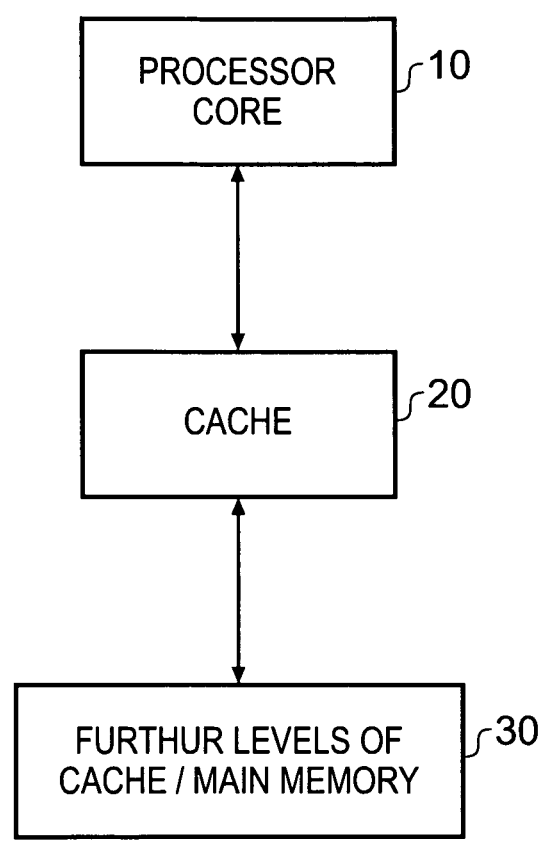
FIG. 1 is a block diagram of a data processing system having a cache in which the techniques of embodiments of the present invention may be employed.

FIG. 1 is a block diagram schematically illustrating a data processing system in accordance with one embodiment. In this embodiment, a processor core 10 interfaces with a cache 20, which in turn interfaces with one or more further levels of cache within a cache hierarchy, and ultimately with main memory, these further levels of cache and main memory being shown schematically by the block 30. The processor core during operation will issue various access requests seeking to access data values from memory. If those data values are located within the cache 20, they will typically be accessed in the cache avoiding the time penalty of having to access any of the further levels of cache or main memory 30. The cache 20 may be a unified cache provided for instructions and data, or alternatively may be formed as a separate instruction cache for storing instructions for access by the processor core, and a further separate data cache for storing data for access by the processor core. Typically the processor core will only perform read access requests in respect of instructions, but may issue either read or write access requests in association with data. Certain regions of memory may be specified as write through (WT) regions, whilst other regions of memory may be specified as write back (WB) regions of memory. Further, some regions of memory may be specified as cacheable whilst others are specified as non-cacheable.

If the processor core issues a write access request specifying an address which is in a cacheable region of memory, then if a hit occurs within the cache 20, the data the subject of the access request will be updated directly in the cache. If the address relates to a write through region of memory, then an update to memory 30 will also be performed at that time (or at least an entry will be made in a write buffer to ensure that the main memory is updated as soon as possible), but if the access address relates to a write back region of memory, then typically no update will be made at that time in the main memory, and instead a dirty bit associated with the relevant cache line will be set to indicate that the cache line is dirty. When a cache line is later evicted from the cache, if the cache line is valid and the dirty bit is set, then an eviction process takes place to update the stored data values in main memory.

The cache 20 may be arranged in a variety of ways, but for the purposes of discussing an embodiment of the present invention it will be assumed that the cache is an n-way set associative cache. This means that for any particular address specified in an access request, and assuming that address relates to a cacheable region of memory, then a lookup procedure will be performed in the cache for a particular set of the cache, the particular set in question being dependent on the address. Each set will typically include one cache line in each of the ways of the cache.

Whilst in FIG. 1 a processor core 10 is shown by way of example, it will be appreciated that other processing units may also be provided within the data processing system in association with a cache such as cache 20, and hence by way of example in alternative embodiments the processing unit may be a digital signal processor (DSP), a hardware accelerator, etc.

Figure 2A:
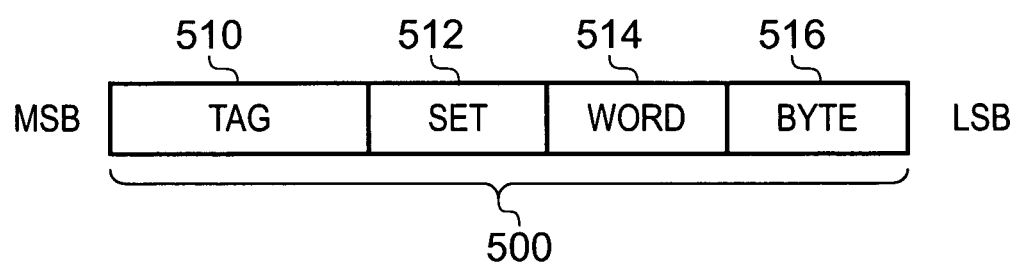
FIG. 2A illustrates the contents of an address output by the processor core of FIG. 1.

FIG. 2A illustrates the contents of an address output by the processor core 10 in association with an access request. The address 500 consists of a tag portion 510, and set, word and byte portions 512, 514, 516, respectively. The set portion 512 of the address 500 is used as an index to identify a particular set within the n-way set associative cache 20. Each of the lines in the set will then have stored in a tag array an associated tag value, which is compared with the tag portion 510 of the address 500 in order to detect whether there is a hit in the set associative cache. The word portion 514 identifies a particular word within the line that is the subject of the access by the processor core, whilst the byte portion 516 allows a particular byte within the word to be specified if required.

Figure 2B:
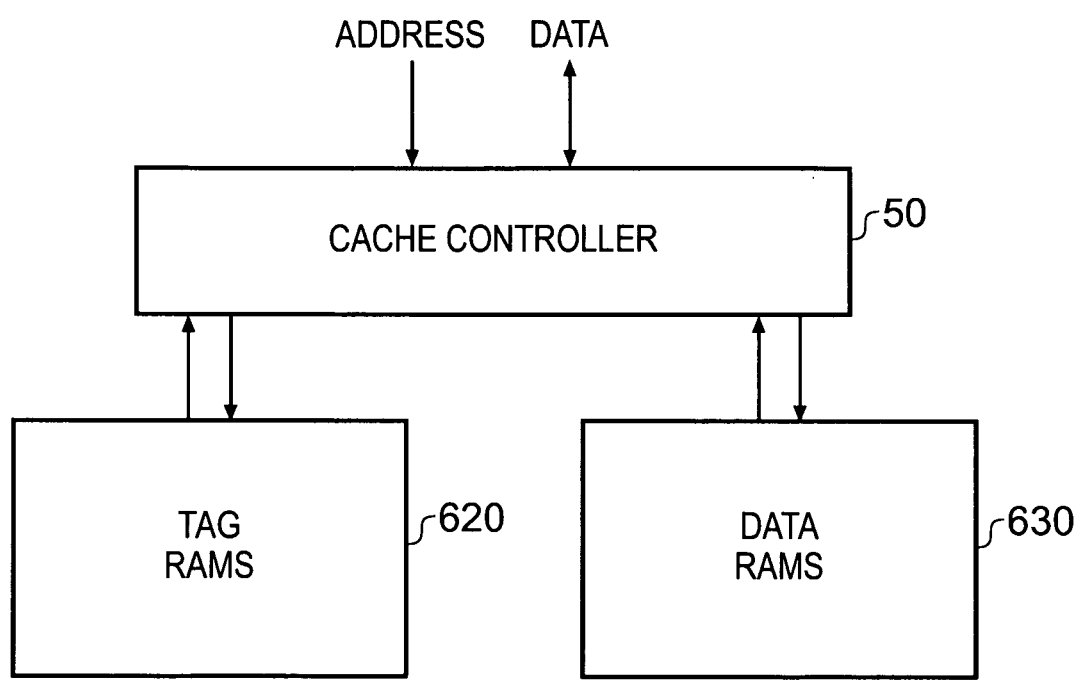
FIG. 2B schematically illustrates the structure of the cache of FIG. 1 in accordance with one embodiment.
Figure 3:
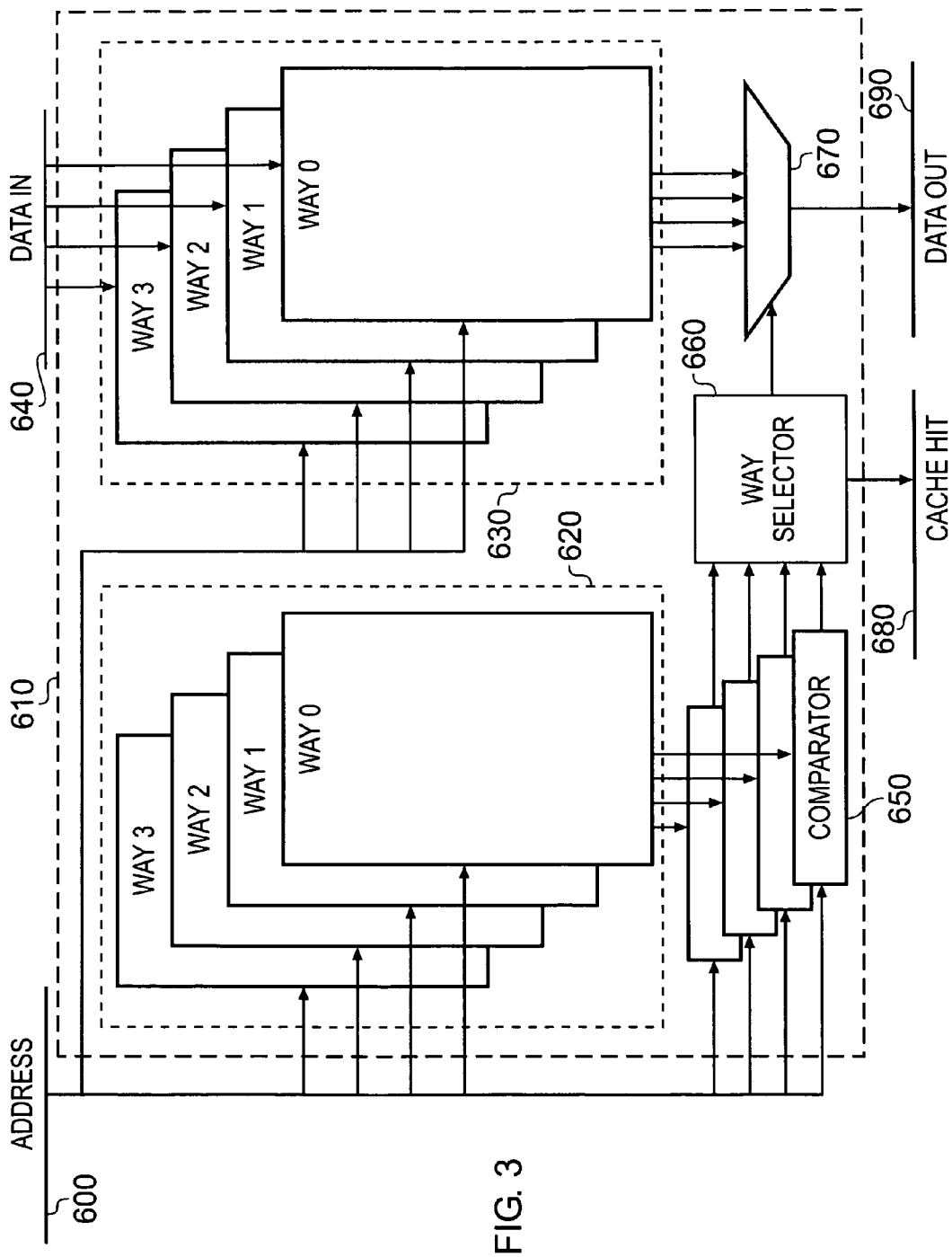
FIG. 3 illustrates in more detail the operation of the cache of FIG. 1 in accordance with one embodiment.

FIG. 2B schematically illustrates the main components provided within the cache 20. The cache lines are provided within the data RAMs 630. For each cache line, an entry will be made within the tag RAMs 620, that entry storing the earlier-mentioned tag value, and also typically including certain control bits, such as a valid bit identifying whether the corresponding cache line has valid data stored in it, and a dirty bit indicating whether the data in the associated cache line is more up to date than the data as stored in memory. Accesses to both the tag RAMs 620 and the data RAMs 630 are performed under the control of the cache controller 50, which receives the address of the access request issued by the processor core, and also receives the write data from the processor core in the event of a write access request, or returns in due course the read data to the processor core for a read access request. It will be appreciated that the cache controller 50 will also have connections to and from the next level of memory 30, but for simplicity these are omitted from FIG. 2B FIG. 3 illustrates in more detail the operation within the n-way set associative cache 20 when a lookup operation for a received access request is performed within the set associative cache 20. In this example the set associative cache 20 is a 4-way set associative cache. The cache comprises four ways, a comparator 650 associated with each way, a way selector 660 and a multiplexer 670. The comparators, way selector and multiplexer will typically be provided within the cache controller 50.

A set of tag RAMs 620 are provided containing a tag RAM memory for each way, and similarly a set of data RAMs 630 are provided comprising a data RAM memory for each way. The data RAM of each way contains a plurality of cache lines that are arranged to store data values. Each set comprises one cache line in each way. Associated with each cache line is an entry in the associated tag RAM in which a tag value is stored.

When a lookup operation is performed, the set portion 512 of the address is routed to each of the tag RAM memories and data RAM memories to identify the cache lines of the relevant set. Within the tag array 620, the tag values for the cache lines identified by the set portion 512 of the address are output to the comparators 650, which also receives the tag portion 510 of the address. Each comparator then compares the tag portion of the address with the tag value received from the corresponding way, and outputs the result of that comparison to the way selector 660. In the event that one of the comparators identifies a match, the way selector outputs a cache hit signal on path 680 to identify to the processor that a hit in the cache has occurred. In the event that no matches are detected by the comparators, the way selector 660 instead outputs a cache miss signal.

Meanwhile, the set portion of the address 512 as routed to the data RAMs 630 causes the relevant cache lines to be accessed within the set. In the event of a read access where a cache hit is detected, the way selector 660 will output a signal to the multiplexer 670 to identify which cache line's data should be output over path 690. The word and byte portions 514, 516 of the address can at this stage be used to identify the particular word or byte to be output.

In the event of a write access which hits in the cache, then if the write access is allowed to proceed the relevant data can be forwarded to the appropriate way of the data RAMs 630 over path 640 for storing in the relevant cache line.

For simplicity, in the above discussion, it is assumed that all of the cache lines contain valid data. If not, this will be indicated by a valid field in the relevant entry in the tag RAMs 620 and any invalid lines would typically be ignored by the comparator circuits 650.

Whilst the above discussion provides a general overview of the operation of a cache, it assumes that the information held in the cache is free from errors. However, as discussed earlier, both hard and soft errors can affect information held within the cache, and accordingly in one embodiment of the present invention an error correction mechanism is provided to seek to enable correct operation of the cache to be maintained even in the presence of hard errors. The mechanism of embodiments of the present invention is based on a "correct-and-retry" scheme. In particular, if an error is detected within one of the cache lines or associated tag RAM entries subjected to the lookup procedure for an access request, then the relevant cache line is cleaned and invalidated, whereafter the access is re-performed. In one embodiment, the mechanism of embodiments of the present invention supports use with caches that can cache from write back regions of memory, and accordingly in such instances the clean and invalidate operation will require the ability to evict cache lines to memory if they are dirty and valid. To support this, it is not only necessary on evicting a cache line to ensure that the data values in the cache line are corrected if need be before being written to memory, but it is also clearly necessary to make sure that the contents of the relevant tag RAM entry are also correct, in order to ensure that the tag value was correct, and also that the valid and dirty bits have been interpreted correctly.

In addition to this, when using a correct-and-retry type of scheme, then if the errors in question were due to hard errors, it is possible that during the retry operation, a linefill operation will be performed in respect of the cache, which may result in the retrieved data being allocated to the same way where the hard error was detected, and this will lead to occurrence of the same problem the next time the data is accessed in the cache.

Figure 4:
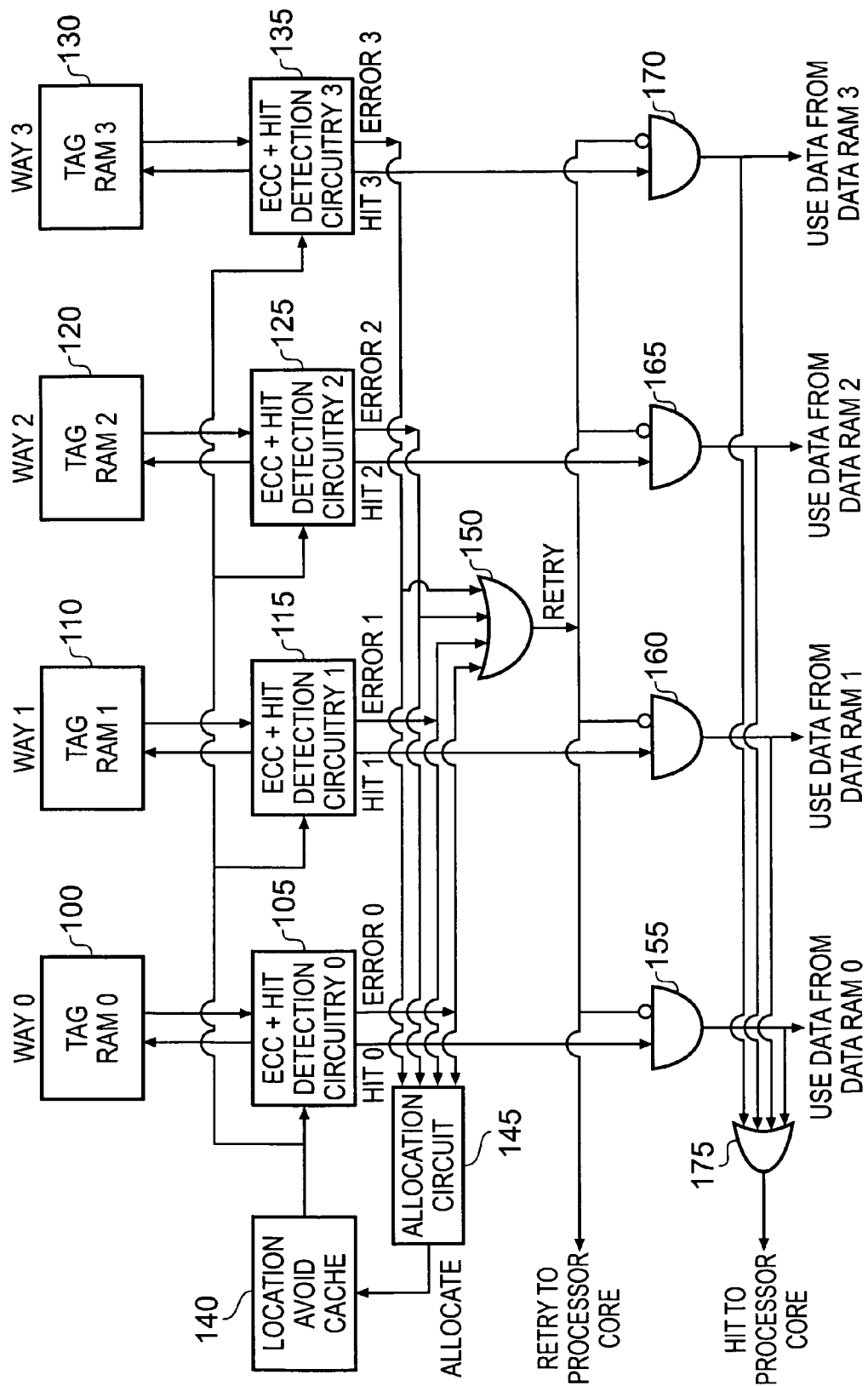
FIG. 4 illustrates in more detail components provided within the cache controller shown in FIG. 2B in accordance with one embodiment of the present invention.

FIG. 4 illustrates components provided within the cache controller 50 in accordance with one embodiment of the present invention to seek to alleviate these problems. In particular, FIG. 4 shows the components provided for handling accesses to the tag RAMs 620 upon receipt of an access request. Accesses to the data RAMs can be handled in an analogous manner, or alternatively a different error correction mechanism may be employed in association with the data RAMs.

As shown in FIG. 4, error correction code and hit detection circuitry 105, 115, 125, 135 is provided in association with each tag RAM 100, 110, 120, 130, one tag RAM being provided for each way of the set associative cache. Each tag RAM entry stores, in addition to the usual tag value, valid and dirty bits, and error correction code data (referred to herein as error data), which is redundant data used to detect the presence of an error in the contents of the tag entry. It will be appreciated that whilst each tag RAM is shown as a single RAM structure, there is no requirement for the tag, valid, dirty and error data values to reside in a single physical RAM and alternatively they may be provided in separate physical RAMs.

On receipt of an access request specifying a cacheable memory address, a lookup procedure is performed by the circuits 105, 115, 125, 135 in the respective tag RAMs 100, 110, 120, 130. In particular, using the general mechanism discussed earlier with reference to FIG. 3, one of the entries in each tag RAM is identified, and its contents returned to the hit detection circuits. In addition to seeking to detect the presence of a cache hit, each circuit 105, 115, 125, 135 also performs error correction code processing using the error data provided in the entry in order to seek to detect the presence of an error. As a result, each circuit 105, 115, 125, 135 outputs a hit signal identifying whether a hit has been detected or not and an error signal indicating whether an error has been detected or not. If the hit signal is set, this indicates a hit, and if the error signal is set, this indicates detection of an error. For the purposes of the present discussion, it will be assumed that a set condition is indicated by a logic 1 level.

All of the error signals are routed to the OR gate 150, which will output a retry signal at a set level if any of the error signals are set. This retry signal will be issued to the processor core, and in one embodiment takes the form of a branch to self control signal that causes the processor core to re-execute the instruction that caused the original access request to be issued. Hence, it can be seen that in accordance with the embodiment shown, if an error occurs in any of the tag RAM entries subjected to the lookup procedure, whether a hit was detected in that tag RAM entry or not, a retry mechanism is instigated.

Further, whenever an error signal is detected, this triggers the allocate circuit 145 to allocate an entry in a location avoid cache 140, the location avoid cache having at least one record for storing a cache line identifier identifying a specific cache line. In particular, in one embodiment, the cache line identifier takes the form of a set identifier and way identifier for identifying a specific cache line. Accordingly, by way of example, if an error is detected in the tag RAM entry of way 1 that was used in the lookup procedure, then the allocate circuit will allocate a line in the location avoid cache 140 for identifying the set number to which that tag RAM entry belongs, and identifying way 1.

Typically the location avoid cache 140 is a very small structure and is not intended to accumulate over time a record of all errors occurring. Instead, it is a simple structure arranged to keep a record of one or more recently detected errors solely to provide a mechanism for enabling the retry operation to operate correctly. In one particular embodiment, the location avoid cache 140 contains a single record.

The allocate circuit 145 can if necessary perform arbitration to arbitrate between the presence of multiple error signals occurring at the same time. In particular, if there are more errors occurring simultaneously than there are actual records in the location avoid cache 140, then the allocate circuit 145 will need to perform arbitration to decide which error is allocated to a record in the location avoid cache. Any of a number of known arbitration schemes could be used, for example random, round-robin, fixed priority, etc.

As also shown in FIG. 4, an inverted version of the retry signal is used as a qualifying signal to the hit signals issued by the various circuits 105, 115, 125, 135. In particular, the AND gates 155, 160, 165, 170 ensure that any hit signal output by the associated circuits 105, 115, 125, 135 is only propagated on to the way selector and multiplexer circuitry 660, 670 of FIG. 3 if the retry signal is not set. Hence, in the absence of a set retry signal, a hit signal issued by one of the circuits can then be used to cause the data values in the corresponding cache line to be accessed. Further, the OR gate 175 is used to generate a hit signal back to the processor core in the event that any of the outputs of the AND gates 155, 160, 165, 170 are set.

Figure 5:
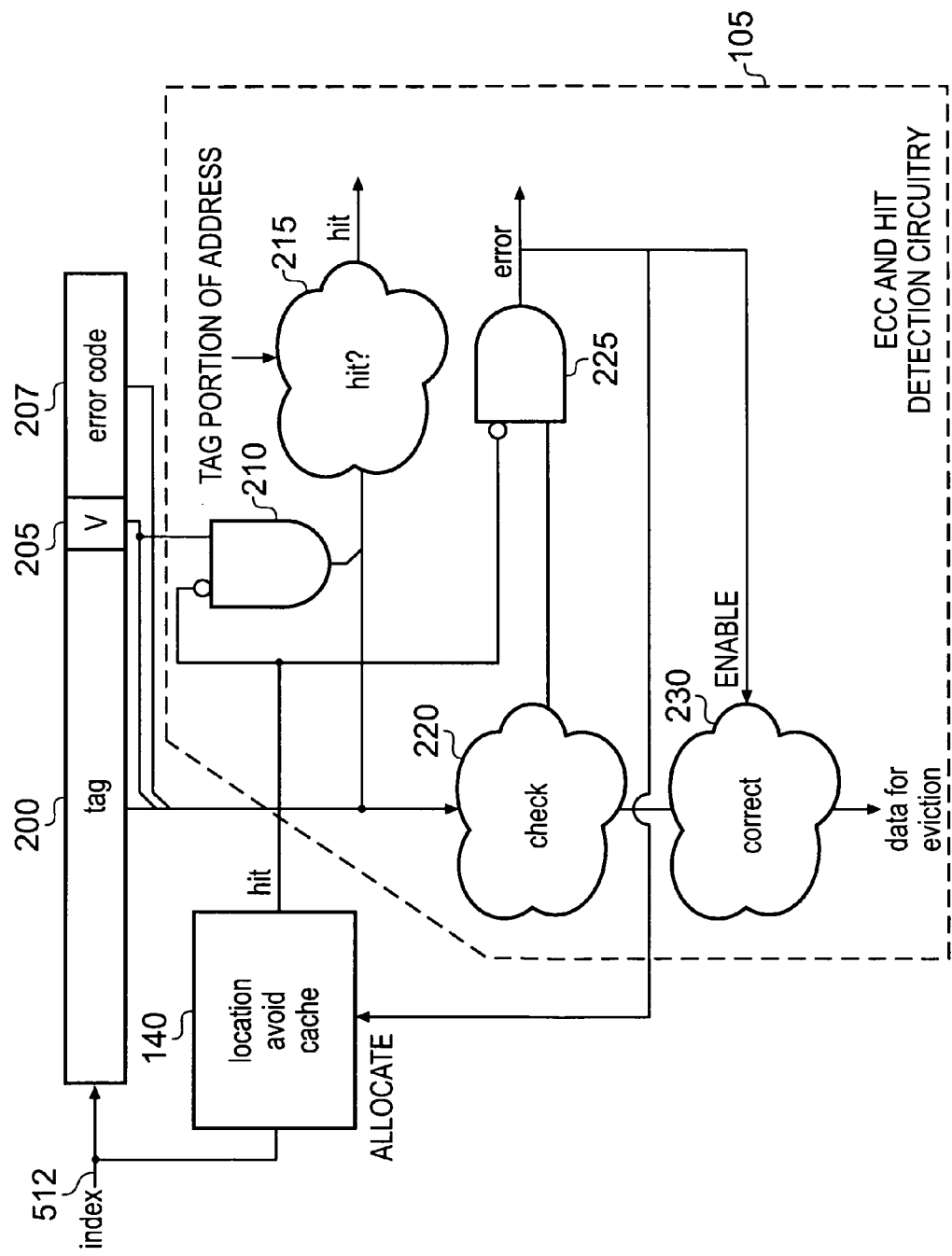
FIG. 5 illustrates in more detail the elements provided within each error correction code and hit detection circuit shown in FIG. 4 in accordance with one embodiment of the present invention.

FIG. 5 illustrates in more detail the components provided within each error correction code and hit detection circuit 105, 115, 125, 135 of FIG. 4. In particular, the error correction code and hit detection circuitry 105 is shown, but each of the other circuits 115, 125, 135 is constructed in the same way.

As shown, the set or index portion 512 of the address is used to identify a particular entry in the tag RAM, that entry including a tag value 200, a valid bit 205 and some error code bits 207. As mentioned earlier, there may also be a dirty bit value in the entry, but that has been omitted for clarity in this diagram. The index portion of the address is also input to the location avoid cache 140 to determine whether there is a record in the location avoid cache which matches the specified index. Hence, if the set identified by the index of the address matches the set identifier in the location avoid cache, then a location avoid hit signal will be output to the error correction code and hit detection circuit associated with the way identifier in that same record of the location avoid cache 140.

If the location avoid hit signal is set at the output of the location avoid cache, then it can be seen that this will cause the AND gates 210, 225 to output a logic zero value irrespective of their other input. In particular, if a logic zero value is output from the AND gate 210, this will indicate to the hit detection logic 215 that the cache line in question is invalid, and accordingly no cache line hit signal will be generated. Further, if the location avoid hit signal is set, this will cause the AND gate 225 not to output a set error signal irrespective of any error check performed by the error check logic 220. Hence, in the presence of a hit in the location avoid cache 140, the error correction code circuitry 220 and hit detection circuitry 215 for the relevant way will identify no error and will issue a miss signal, thereby ensuring correct operation of the cache even in the presence of a hard error in the relevant cache line. In particular, assuming the data value the subject of the access request is not found in any of the other ways of the cache, and no other errors are detected, this will cause a cache miss operation to be invoked, as a result of which the required data value will be accessed from a lower level of the cache hierarchy or from main memory. Further, if a linefill operation is performed as part of that cache miss procedure, the hit indication from the location avoid cache will also avoid the associated cache line being chosen as the allocated cache line for that linefill procedure, and instead a victim cache line will be chosen from one of the other ways. This avoids one potential problem that can arise when using a correct and retry scheme, namely that the affected data could be flushed from the cache only to be re-retrieved into the same location in the cache during the subsequent linefill operation, leading to reoccurrence of the problem the next time the data is sought to be accessed. Instead, through use of the location avoid cache, it will be ensured that the data retrieved as part of the retry operation will, if allocated into the cache, be allocated to a different cache line.

As is apparent from FIG. 5, if there is not a hit in the location avoid cache, then an error check operation is performed by the logic 220, and if an error is detected that error is output from the AND gate 225. In the event of a set error signal, this will cause correction logic 230 to be enabled to correct the error, and then a clean and invalidate operation will be performed. For a write back region whose cache line content is dirty, this will involve eviction of the data from the cache line as well as invalidation of the cache line following eviction. Further, if the error signal is set, this will cause an allocation operation to be performed to allocate a record in the location avoid cache to identify the set and way information for the cache line in question so that when the access is retried, a hit will occur in the location avoid cache.

In the absence of a location avoid cache hit, and assuming no error is generated, then it will be seen that the hit logic 215 operates in the usual manner and will generate a set hit signal if the valid bit 205 is set, and the tag value 200 matches the tag portion of the address.

Figure 6A:
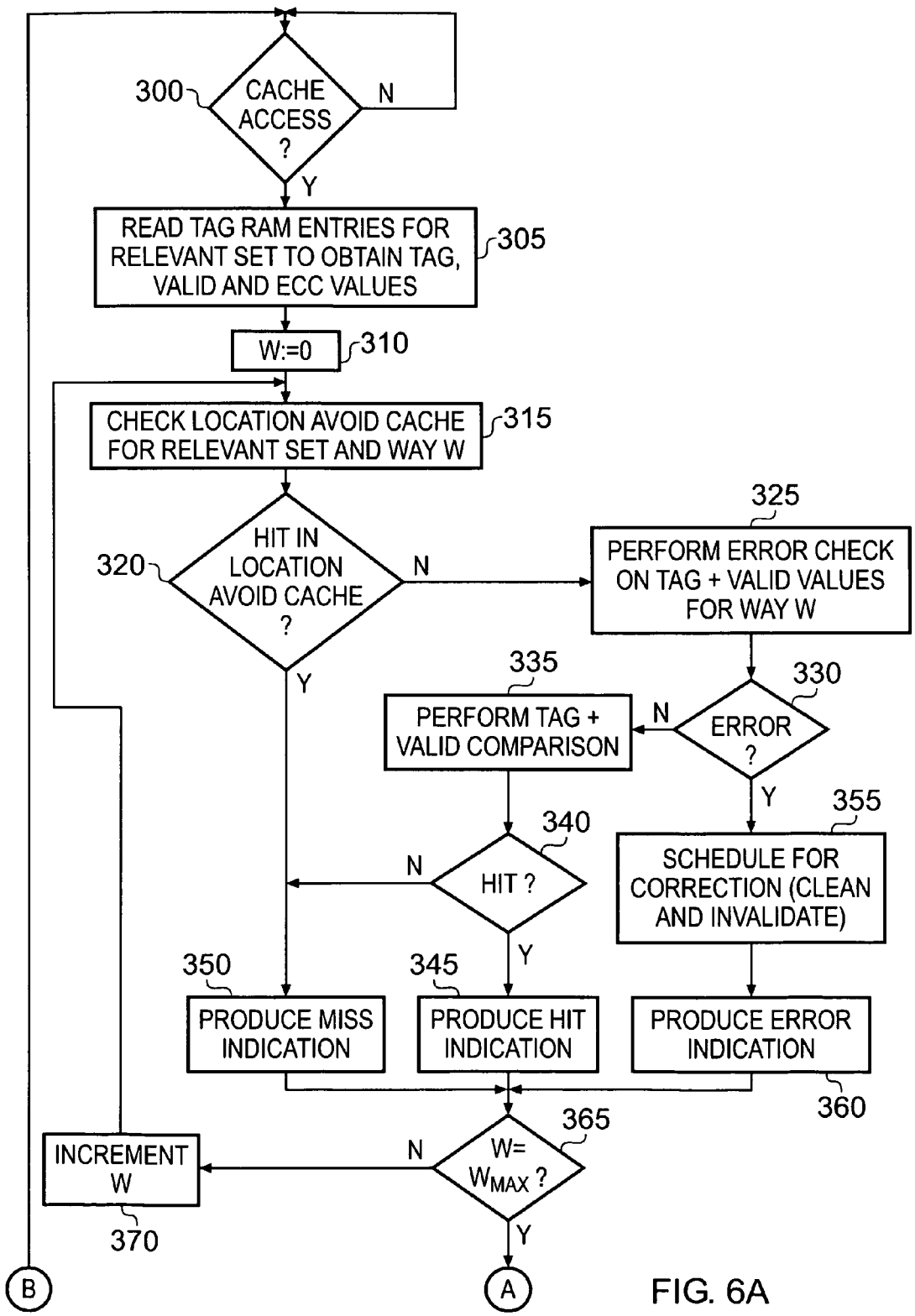
FIGS. 6A and 6B are flow diagrams illustrating how a cache access is handled by the cache controller of FIG. 2B in accordance with one embodiment of the present invention.
Figure 6B:
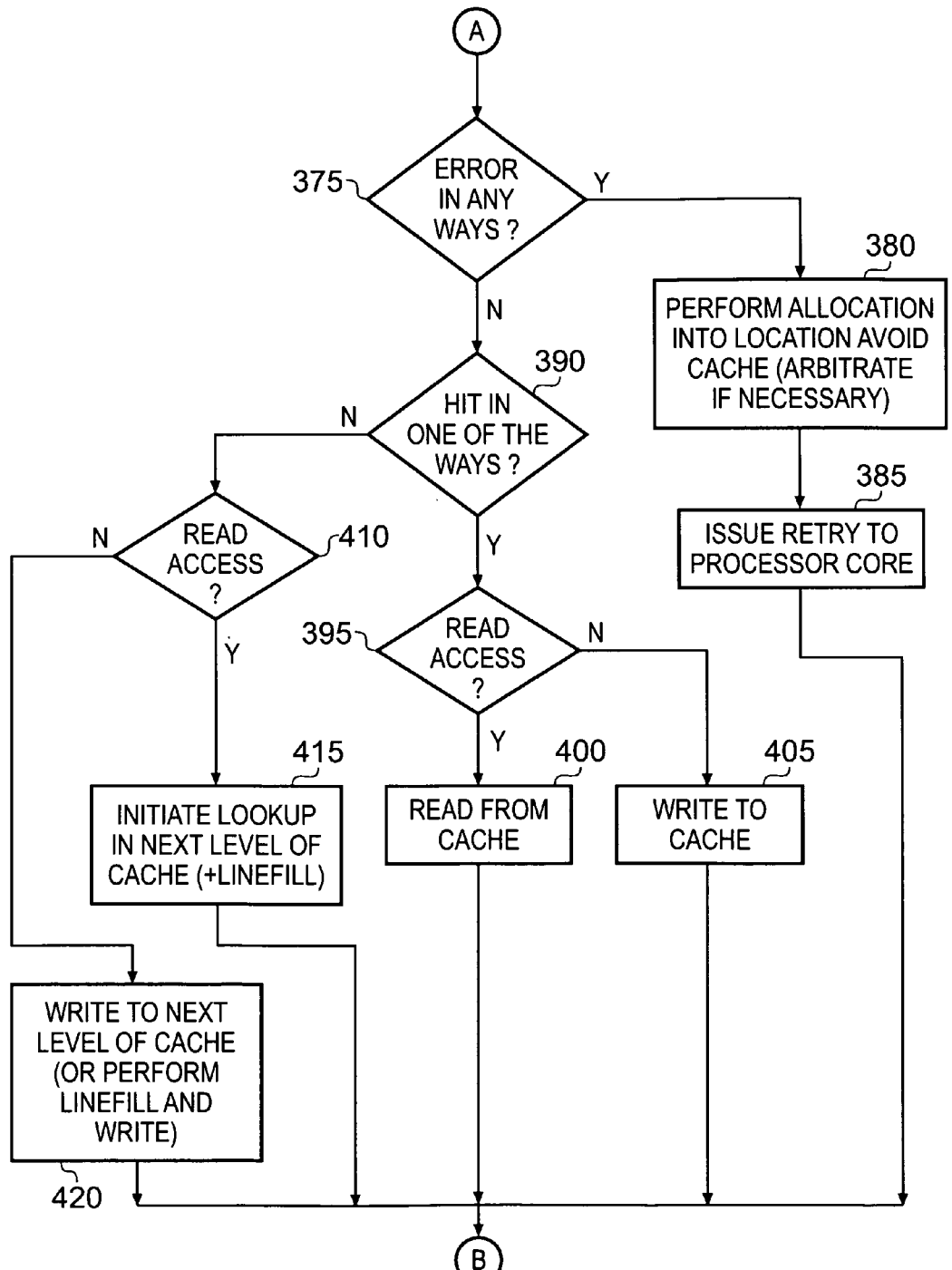

FIGS. 6A and 6B are flow diagrams schematically illustrating the operation of the cache controller 50 in accordance with one embodiment of the present invention. At step 300, it is determined if there is a cache access taking place, and if so at step 305 the tag RAM entries for the relevant set are read in order to obtain the tag, valid and ECC code values. Thereafter, at step 310, the way value w is set equal to zero, whereafter the location avoid cache is referenced for the relevant set and way at step 315. It is then determined at step 320 whether there is a hit in the location avoid cache, and if so a cache line miss indication is produced at step 350 by the logic 215.

However, if a hit is not detected in the location avoid cache, then an error check is performed at step 325 using the tag, valid and their associated error code values for way w, this being performed by the check logic 220 of FIG. 5. It is then determined at step 330 if there is an error, and if so the relevant cache line is scheduled for correction at step 355, this involving use of the correction logic 230 of FIG. 5. When the correction operation is performed, this will involve cleaning and invalidating the relevant cache line In addition to step 355, an error indication is produced at step 360. If no error is detected at step 330, then a tag and valid comparison is performed by the hit logic 215, whereafter at step 340 it is determined whether a cache line hit has been detected. If it has, a cache line hit indication is produced at step 345, whereas otherwise a cache line miss indication is produced at step 350.

Thereafter, it is determined whether the way value w is equal to $w_{max}$, and if not the way value is incremented at step 370 and the process returns to step 315.

Whilst for ease of illustration the above steps have been described as occurring sequentially for each way, it will be appreciated for example from FIG. 4 that in one embodiment the sequence of steps 315 to 360 will be performed in parallel for each of the ways using the separate ECC and hit detection circuits provided for each way.

Once it is determined at step 365 that the necessary checks have been performed for each way, then at step 375 it is determined whether an error has been detected in any of the ways. If so, an allocation is performed into the location avoid cache at step 380 using the allocate circuit 145, with arbitration being performed if necessary. Thereafter, a retry signal is issued to the processor core by gate 150 at step 385.

If no error is detected at step 375, it is then determined at step 390 whether there is a hit in one of the ways, and if so it is then determined at step 395 whether the access request in question is a read access request. If it is, then the data the subject of the access request is read from the cache at step 400, whereas otherwise the access is a write access, and the write is performed to the relevant cache line at step 405.

If no hit is detected at step 390, then at step 410 it is determined whether the access is a read access request, and if it is a lookup procedure is initiated in the next level of the cache at step 415. Typically this will also involve a linefill operation being performed in the cache so that subsequently a cache line hit will be detected.

If it is determined at step 410 that the access is in fact a write access, then at step 420 the write operation is propagated to the next level of the cache hierarchy/main memory, or instead a linefill operation is performed, during which the write data will be merged with the data retrieved as part of the linefill operation and then written into the relevant cache line entry.

Following steps 420, 415, 400, 405, 385, the process returns to step 300 to await the next cache access.

Figure 7A:
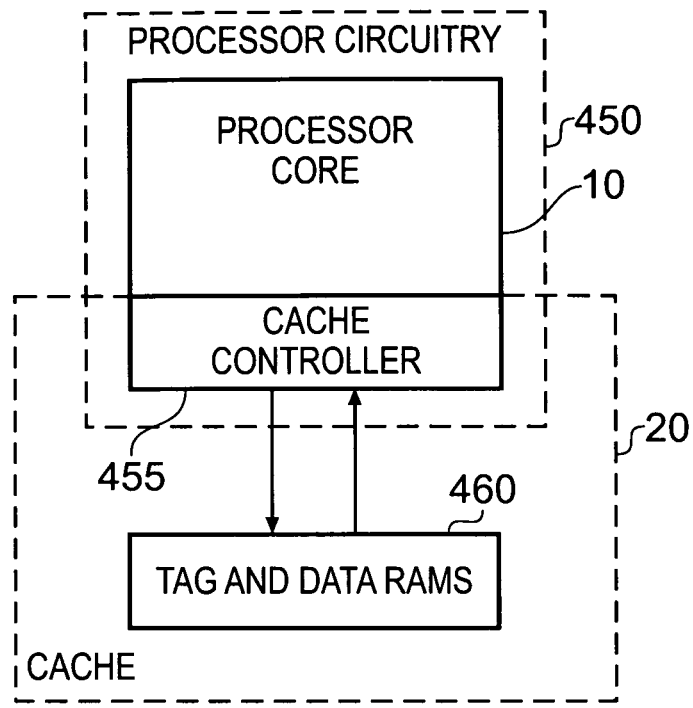
FIG. 7A illustrates how in one embodiment the cache controller is implemented as part of processor circuitry.

FIG. 7A schematically illustrates how in one embodiment the cache controller of a cache may be provided as part of processor circuitry also including the processor core. Hence, the processor core 10 may be merged with the cache controller 455 to form processor circuitry 450. As a result, the cache 20 is actually formed by the tag and data RAMs 460 in association with the cache controller 455 provided within the processor circuitry 450.

As a result, the various elements of the cache controller, including the location avoid cache, will be provided within the processor circuitry 450.

Figure 7B:
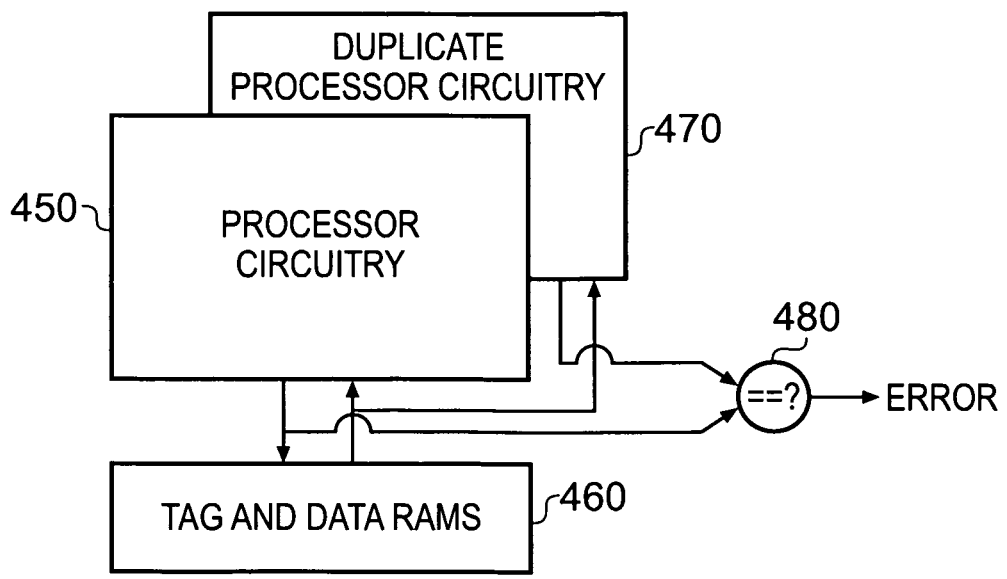
FIG. 7B illustrates an arrangement in accordance with one embodiment of the present invention where duplicate processor circuitry is provided to seek to detect errors in operations of the processor circuitry.

Whilst the above described techniques assist in detecting and handling errors in the tag and data RAMs, they do not in themselves deal with any error that could occur in the location avoid cache. In one embodiment, namely a safety critical embodiment, duplicate processor circuitry 470 is provided to operate in parallel with the processor circuitry 450, as shown in FIG. 7B. Both the processor circuitry 450 and the duplicate processor circuitry 470 receive the output from the tag and data RAMs 460, but the tag and data RAMs 460 are controlled only by the output from the processor circuitry 450. However, that output is also passed to a comparator 480 which further receives the corresponding output from the duplicate processor circuitry 470. In the event of any discrepancy between the output from the processor circuitry 450 and the duplicate processor circuitry 470, an error signal is generated and this can be used to initiate any required recovery operation. Hence, by way of example, if an error did occur in the contents of the location avoid cache, this would be indicated by the difference in output between the processor circuitry 450 and the duplicate processor circuitry 470, and accordingly an error would be generated.

From the above described embodiments of the present invention, it will be seen that a small structure in the form of a location avoid cache is used to facilitate correct operation of the cache even in the presence of hard errors. No attempt is made to distinguish between soft and hard errors, and instead whenever an error occurs, a correct and retry mechanism is instigated, and additionally one of the records in the location avoid cache is allocated to store a set and way identifier for the cache line/tag RAM entry where the error was detected. This ensures that the retry mechanism will succeed irrespective of whether the error was a soft error or a hard error. Whilst if the error was a soft error, there would be an expectation that the retry mechanism would operate correctly anyway, it has been found that it is much simpler and more efficient to merely use the location avoid cache mechanism for any error rather than seeking to detect whether the error is in fact a hard error or a soft error. Through use of such a mechanism, if any hard errors do occur during normal operation of the cache, they can effectively be temporarily isolated through use of the location avoid cache to ensure that the retry mechanism proceeds correctly.

It should be noted that no permanent record of the hard errors is seeking to be retained, and instead the small simple mechanism used in embodiments of the present invention is merely intended to ensure that the retry following the detection of the error is successful. In due course, contents in the location avoid cache will be overwritten by identifiers for new cache line locations where errors are detected, and the location avoid cache only needs store temporary information that is useful in ensuring correct operation of the retry operation occurring following detection of a current error.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:
a processing unit for performing data processing operations;
cache storage for storing data values for access by the processing unit when performing said data processing operations, the cache storage comprising data storage having a plurality of cache lines for storing data values, and address storage having a plurality of entries, each entry identifying for an associated cache line an address indication value, and each entry having associated error data;
cache access circuitry, responsive to an access request issued by the processing unit specifying an access address, to perform a lookup procedure to determine with reference to the address indication value held in at least one entry of the address storage whether a hit condition exists in one of said cache lines;
error detection circuitry, responsive to the access request, to determine with reference to the error data associated with said at least one entry of the address storage whether an error condition exists for that entry;
cache location avoid storage having at least one record, each record for storing a cache line identifier identifying a specific cache line;
on detection of said error condition, one of said at least one records in the cache location avoid storage being allocated to store the cache line identifier for the specific cache line associated with the entry for which the error condition was detected, the error detection circuitry causing a clean and invalidate operation to be performed in respect of the specific cache line, and causing the access request to be re-performed;
the cache access circuitry excluding any specific cache line identified in the cache location avoid storage from the lookup procedure; and
wherein at least a part of the cache storage configured to operate as a write back cache, and the error detection circuitry includes error correction circuitry, responsive to the error condition, to apply an error correction operation to correct content of the entry for which that error condition was detected, prior to the clean and invalidate operation being performed.

2. A data processing apparatus as claimed in claim 1, wherein the access request is a read access request.

3. A data processing apparatus as claimed in claim 1, wherein the cache location avoid storage comprises a single record, and hence at any point in time, only identifies a single specific cache location to be avoided.

4. A data processing apparatus as claimed in claim 1, wherein the content of each entry includes, in addition to the address indication value, a valid identifier identifying if the associated cache line is valid, and the error detection circuitry determines whether the error condition exists even if the valid indication as stored in the entry being reviewed by the error detection circuitry indicates that the associated cache line is invalid.

5. A data processing apparatus as claimed in claim 1, wherein when a cache line in the cache storage needs to be selected as an allocated cache line for the storage of data values, any specific cache line identified in the cache location avoid storage is excluded from selection as the allocated cache line.

6. A data processing apparatus as claimed in claim 1, wherein:
the cache storage is an n way set associative cache, and the access address of the access request identifies a particular set in the cache having a cache line in each way of the cache;
each cache line identifier stored in the cache location avoid storage identifies the specific cache line by identifying a cache set and at least one cache way; and
the error detection circuitry performs error detection for each cache line in the particular set other than any specific cache line of that particular set identified in the cache location avoid storage.

7. A data processing apparatus as claimed in claim 1, wherein the cache location avoid storage is formed as a cache.

8. A data processing apparatus as claimed in claim 7, wherein the cache location avoid storage is formed as a fully associative cache.

9. A data processing apparatus as claimed in claim 1, wherein:
the processing unit, cache access circuitry, error detection circuitry and cache location avoid storage are provided within processing circuitry, the processing circuitry being duplicated in the data processing apparatus by duplicate processing circuitry, the data processing apparatus further comprising:
comparison circuitry for detecting errors occurring in operations of said processing circuitry by comparison with operations of said duplicate processing circuitry.

10. A data processing circuitry as claimed in claim 1, wherein each cache line has associated cache line error data, and the error detection circuitry further determines the presence of the error condition if the cache line error data for any cache line whose associated address storage entry is referenced during the lookup procedure indicates an error.

11. A data processing apparatus as claimed in claim 1, wherein the error detection circuitry causes the access request to be re-performed by issuing a branch to self control signal to the processing unit to cause the processing unit to re-execute an instruction that caused the access request to be issued.

12. A data processing apparatus as claimed in claim 1, wherein whilst the cache access circuitry excludes any specific cache line identified in the cache location avoid storage from the lookup procedure, the error detection circuitry is arranged to detect whether an error condition exists for the entry associated with that specific cache line, and on such detection to produce a hard error detect signal indicating that a hard error has been detected.

13. A data processing apparatus as claimed in claim 1, further comprising allocation circuitry for allocating said one of the records of the cache location avoid storage on detection of said error condition, if every record of the cache location avoid storage has an existing cache line identifier stored therein at the time said error condition is detected, the allocation circuitry invalidating one of said existing cache line identifiers to free said one of the records to be allocated for storing the cache line identifier for the specific cache line associated with the entry for which the error condition was detected.

14. Processing circuitry for coupling with cache storage to access data values stored in the cache storage, the cache storage comprising data storage having a plurality of cache lines for storing data values, and address storage having a plurality of entries, each entry identifying for an associated cache line an address indication value, and each entry having associated error data, the processing circuitry comprising:
 a processing unit for performing data processing operations;
 cache access circuitry, responsive to an access request issued by the processing unit specifying an access address, to perform a lookup procedure to determine with reference to the address indication value held in at least one entry of the address storage whether a hit condition exists in one of said cache lines;
 error detection circuitry, responsive to the access request, to determine with reference to the error data associated with said at least one entry of the address storage whether an error condition exists for that entry;
 cache location avoid storage having at least one record, each record for storing a cache line identifier identifying a specific cache line;
 on detection of said error condition, one of said at least one records in the cache location avoid storage being allocated to store the cache line identifier for the specific cache line associated with the entry for which the error condition was detected, the error detection circuitry causing a clean and invalidate operation to be performed in respect of the specific cache line, and causing the access request to be re-performed;
 the cache access circuitry excluding any specific cache line identified in the cache location avoid storage from the lookup procedure; and
 wherein at least a part of the cache storage is configured to operate as a write back cache, and the error detection circuitry includes error correction circuitry, responsive to the error condition, to apply an error correction operation to correct content of the entry for which that error condition was detected, prior to the clean and invalidate operation being performed.

15. A method of handling errors in a data processing apparatus having a processing unit for performing data processing operations, and cache storage for storing data values for access by the processing unit when performing said data processing operations, the cache storage comprising data storage having a plurality of cache lines for storing data values, and address storage having a plurality of entries, each entry identifying for an associated cache line an address indication value, at least a part of the cache storage configured to operate as a write back cache, and the method comprising the steps of:
 storing error data in association with each entry in the address storage;
 responsive to an access request issued by the processing unit specifying an access address, performing a lookup procedure to determine with reference to the address indication value held in at least one entry of the address storage whether a hit condition exists in one of said cache lines;
 responsive to the access request, determining with reference to the error data associated with said at least one entry of the address storage whether an error condition exists for that entry;
 providing a cache location avoid storage having at least one record, each record for storing a cache line identifier identifying a specific cache line;
 on detection of said error condition, allocating one of said at least one records in the cache location avoid storage to store the cache line identifier for the specific cache line associated with the entry for which the error condition was detected;
 performing a clean and invalidate operation in respect of the specific cache line, and causing the access request to be re-performed;
 when performing the lookup procedure for the access request, excluding any specific cache line identified in the cache location avoid storage from the lookup procedure; and
 responsive to the error condition, applying an error correction operation to correct content of the entry for which that error condition was detected, prior to the performing of the clean and invalidate operation.

16. A data processing apparatus comprising:
 processing means for performing data processing operations;
 cache storage means for storing data values for access by the processing means when performing said data processing operations, the cache storage means comprising data storage means having a plurality of cache lines for storing data values, and address storage means having a plurality of entries, each entry identifying for an associated cache line an address indication value, and each entry having associated error data;
 cache access means, responsive to an access request issued by the processing means specifying an access address, for performing a lookup procedure to determine with reference to the address indication value held in at least one entry of the address storage means whether a hit condition exists in one of said cache lines;
 error detection means, responsive to the access request, for determining with reference to the error data associated with said at least one entry of the address storage means whether an error condition exists for that entry;
 cache location avoid storage means having at least one record, each record for storing a cache line identifier identifying a specific cache line;
 on detection of said error condition, one of said at least one records in the cache location avoid storage means being allocated to store the cache line identifier for the specific cache line associated with the entry for which the error condition was detected, the error detection means causing a clean and invalidate operation to be performed in respect of the specific cache line, and causing the access request to be re-performed;
 the cache access means excluding any specific cache line identified in the cache location avoid storage means from the lookup procedure; and wherein at least a part of the cache storage means is configured to operate as a write back cache, and the error detection means includes error correction means for applying, responsive to the error condition, an error correction operation to correct content of the entry for which that error condition was detected, prior to the clean and invalidate operation being performed.

* * * * *